United States Patent
Di Vincenzo et al.

(10) Patent No.: US 11,798,608 B2
(45) Date of Patent: Oct. 24, 2023

(54) TECHNIQUES TO PERFORM A SENSE OPERATION

(71) Applicant: Micron Technology, Inc., Boise, ID (US)

(72) Inventors: Umberto Di Vincenzo, Capriate San Gervasio (IT); Michele Maria Venturini, Milan (IT)

(73) Assignee: Micron Technology, Inc., Boise, ID (US)

( * ) Notice: Subject to any disclaimer, the term of this patent is extended or adjusted under 35 U.S.C. 154(b) by 114 days.

(21) Appl. No.: 17/646,259

(22) Filed: Dec. 28, 2021

(65) Prior Publication Data

US 2023/0206978 A1    Jun. 29, 2023

(51) Int. Cl.
  *G11C 11/22*    (2006.01)
  *G11C 7/12*    (2006.01)
  *H10B 53/20*    (2023.01)

(52) U.S. Cl.
  CPC ............ *G11C 11/2273* (2013.01); *G11C 7/12* (2013.01); *G11C 11/221* (2013.01); *H10B 53/20* (2023.02)

(58) Field of Classification Search
  CPC ..... G11C 11/2273; G11C 7/12; G11C 11/221; H10B 53/20
  See application file for complete search history.

(56) References Cited

U.S. PATENT DOCUMENTS

| | | | | |
|---|---|---|---|---|
| 2006/0114733 | A1* | 6/2006 | Hosono | G11C 16/26 365/207 |
| 2017/0315737 | A1* | 11/2017 | Kajigaya | G11C 7/12 |
| 2019/0333563 | A1* | 10/2019 | Di Vincenzo | G11C 11/2257 |
| 2019/0341094 | A1* | 11/2019 | Hattori | G11C 11/221 |
| 2020/0051606 | A1* | 2/2020 | Di Vincenzo | G11C 7/06 |
| 2020/0211623 | A1* | 7/2020 | Raad | G11C 7/065 |

\* cited by examiner

*Primary Examiner* — Khamdan N. Alrobaie
(74) *Attorney, Agent, or Firm* — Holland & Hart LLP

(57) ABSTRACT

Methods, systems, and devices for techniques to perform a sense operation are described. In some examples, a memory device may include a pair of transistor to precharge a digit line. A first transistor of the pair of transistors may be coupled with a first node and a second transistor of the pair of transistors may be coupled with a second node. In some cases, the first node and the second node may be selectively coupled via a transistor. The first and second transistors may be activated to precharge the first and second nodes. In some examples, a pulse may be applied to a capacitor coupled with the second node to transfer a charge to the digit line. In some cases, the cascode transistor may maintain or control the voltage of the digit line to be at or below an upper operating voltage of the memory cell.

25 Claims, 6 Drawing Sheets

TECHNIQUES TO PERFORM A SENSE OPERATION

FIELD OF TECHNOLOGY

The following relates generally to one or more systems for memory and more specifically to techniques to perform a sense operation.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
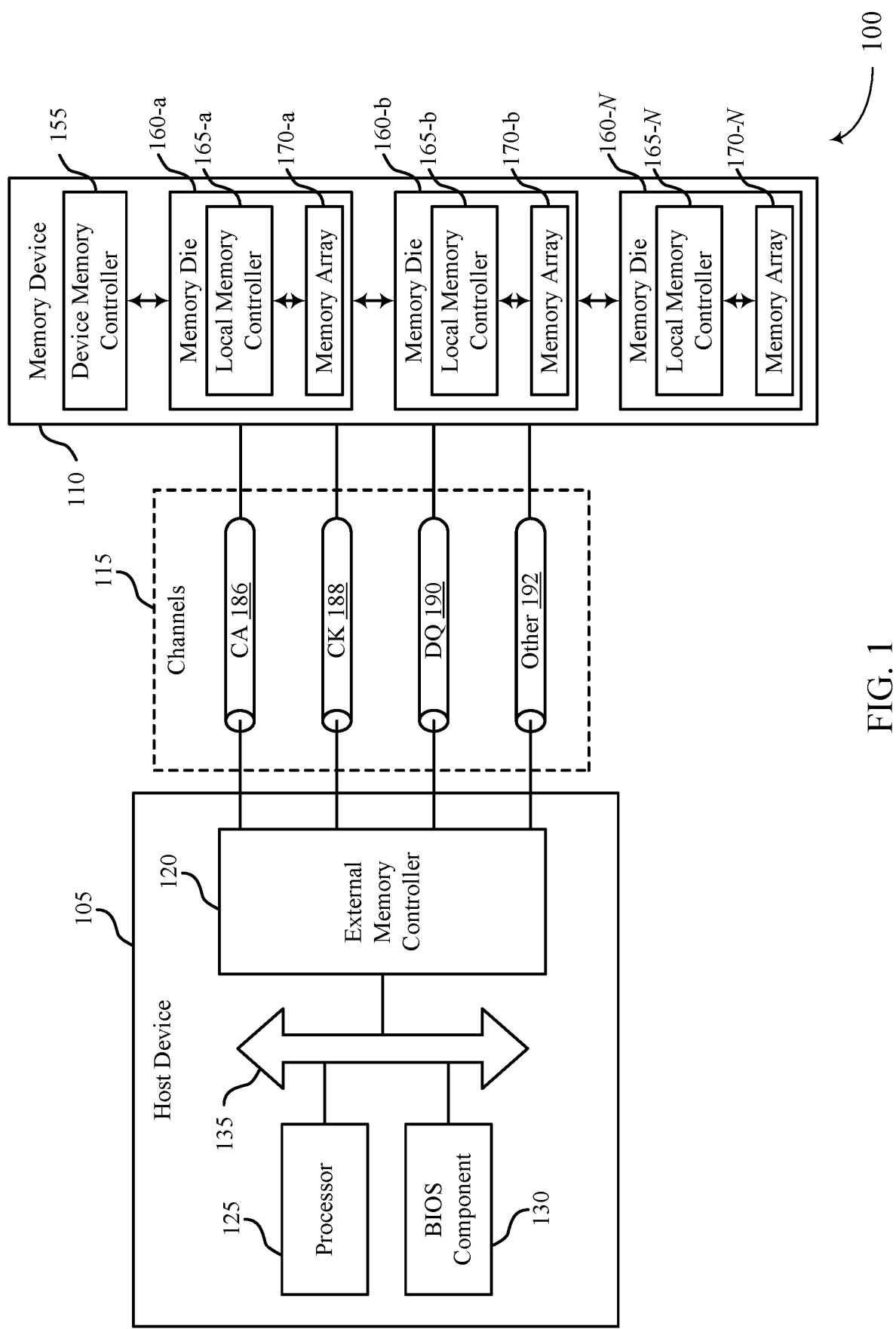
FIG. 1 illustrates an example of a system that supports techniques to perform a sense operation in accordance with examples as disclosed herein.

In some cases, a memory device (e.g., an FeRAM device) may implement a sensing scheme to determine a logic state stored in a memory cell. For example, a sensing scheme may include precharging a digit line coupled with the memory cell. A capacitor (e.g., a ferroelectric capacitor) of the memory cell may then be coupled with the digit line to extract a charge from the digit line. In some cases, the magnitude of the charge extracted from the digit line, and thus the resulting voltage of the digit line, may depend on the logic state stored in the memory cell. In some cases, a sensing scheme may include a boosting phase to transfer charge to the digit line as the memory cell extracts charge from the digit line. Some sensing schemes may include a long precharging phase to precharge the digit line, which may increase system latency and power consumption. Additionally, some sensing schemes may place undue stress on the memory cell. For example, during the boosting phase, a large voltage may be applied to the memory cell, which may cause wear or memory cell fatigue, and may reduce the usable life of the memory cell. Accordingly, methods to improve sensing may be desired.

As disclosed herein, a memory device may include circuitry to increase the reliability and efficiency of access operations of a memory cell. In some examples, the memory device may include a transistor to precharge the digit line. For example, a first transistor may be coupled with a first node, such as the digit line, and may precharge the digit line prior to selecting a memory cell for a read operation. In some cases, a second transistor may be coupled with a second node, which may have a capacitor used in a sense operation (e.g., sense or boost capacitor). The second transistor may precharge the second node as the digit line is precharged. In some cases, the digit line and the second node may be selectively coupled with each other via a transistor, such as a cascode transistor. During a precharge phase of a sense operation, the first and second transistors may be activated to electronically couple a precharge voltage with the first and second nodes, respectively. In some cases, the duration of the precharge phase may be relatively short (e.g., compared to a precharge operation performed using a single transistor). In some examples, the sense operation may include a boost phase. During the boost phase, a pulse may be applied to a capacitor coupled with the second node to transfer a charge to the digit line. In some cases, the cascode transistor may maintain or control the voltage of the digit line to be at or below an upper operating voltage of the memory cell, which may mitigate undue stress on the memory cell. Accordingly, the sense operation may reduce access operation time, reduce wear on the memory cell, and reduce voltage used in access operations, which may improve efficiency, improve reliability, and reduce power consumption of the memory device.

Features of the disclosure are initially described in the context of systems and dies as described with reference to FIGS. 1 and 2. Features of the disclosure are described in the context of a circuit and a timing diagram as described with reference to FIGS. 3-4. These and other features of the disclosure are further illustrated by and described with reference to an apparatus diagram and flowcharts that relate to techniques to perform a sense operation as described with reference to FIGS. 5-6.

FIG. 1 illustrates an example of a system 100 that supports techniques to perform a sense operation in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, a memory device 110 or a memory array 170 may include circuitry to increase the reliability and efficiency of access operations of a memory cell. In some examples, the circuitry may include a first transistor to precharge a digit line of the memory array 170. For example, the first transistor may be coupled with a first node, such as the digit line, and may precharge the digit line. A second transistor may be coupled with a second node, which may be coupled with a capacitor (e.g., sense capacitor or boost capacitor). The second transistor may precharge the second node while the first transistor precharges the digit line. In some cases, the digit line and the second node may be selectively coupled with each other via a transistor, such as a cascode transistor. During a precharge phase of a sense operation, the first transistor and second transistor may be activated to electronically couple a precharge voltage with the first and second nodes, respectively. In some examples, the sense operation may include a boost phase. During the boost phase, a pulse may be applied to a capacitor coupled with the second node to transfer a charge to the digit line. In some cases, the cascode transistor may maintain or control the voltage of the digit line to be at or below an upper operating voltage of the memory cell, which may mitigate undue stress on the memory cell.

Figure 2:
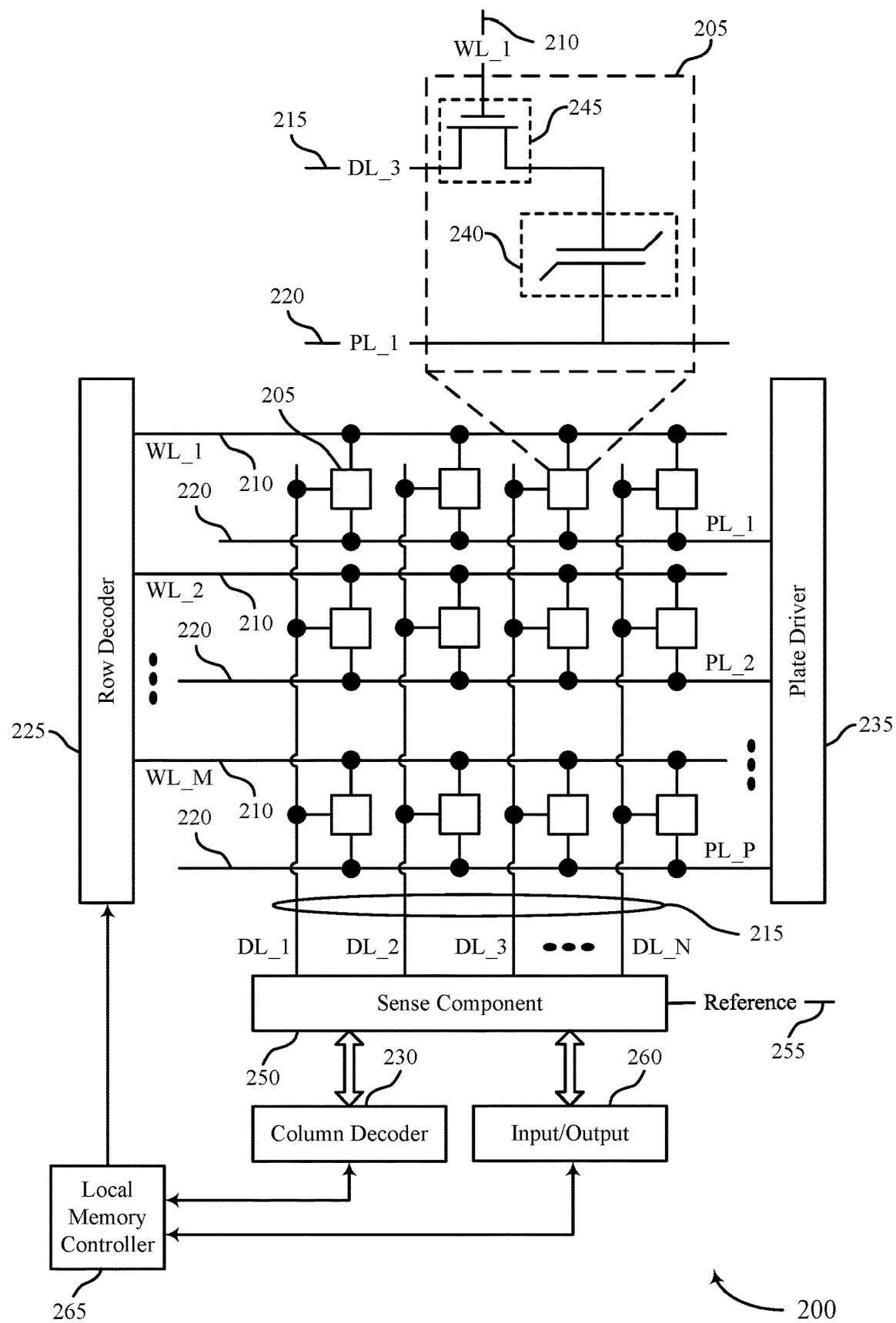
FIG. 2 illustrates an example of a memory die that supports techniques to perform a sense operation in accordance with examples as disclosed herein.

FIG. 2 illustrates an example of a memory die 200 that supports techniques to perform a sense operation in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference 255. Based on that comparison, the sense component 250 may determine a logic state that is stored on the memory cell 205.

In some examples, a memory die 200 may include circuitry to increase the reliability and efficiency of access operations of a memory cell 205. In some examples, the circuitry may include a first transistor to precharge a digit line 215 of the memory die 200. For example, the first transistor may be coupled with a first node, such as the digit line 215, and may precharge the digit line 215. A second transistor may be coupled with a second node, which may be coupled with a capacitor (e.g., sense capacitor or boost capacitor). The second transistor may precharge the second node while the first transistor precharges the digit line 215. In some cases, the digit line 215 and the second node may be selectively coupled to each other via a transistor, such as a cascode transistor. During a precharge phase of a sense operation, the first and second transistors may be activated to electronically couple a precharge voltage with the first and second nodes, respectively. In some examples, the sense operation may include a boost phase. During the boost phase, a pulse may be applied to a capacitor coupled with the second node to transfer a charge to the digit line. In some cases, the cascode transistor may maintain or control the voltage of the digit line to be at or below an upper operating voltage of the memory cell 205, which may mitigate undue stress on the memory cell 205.

Figure 3:
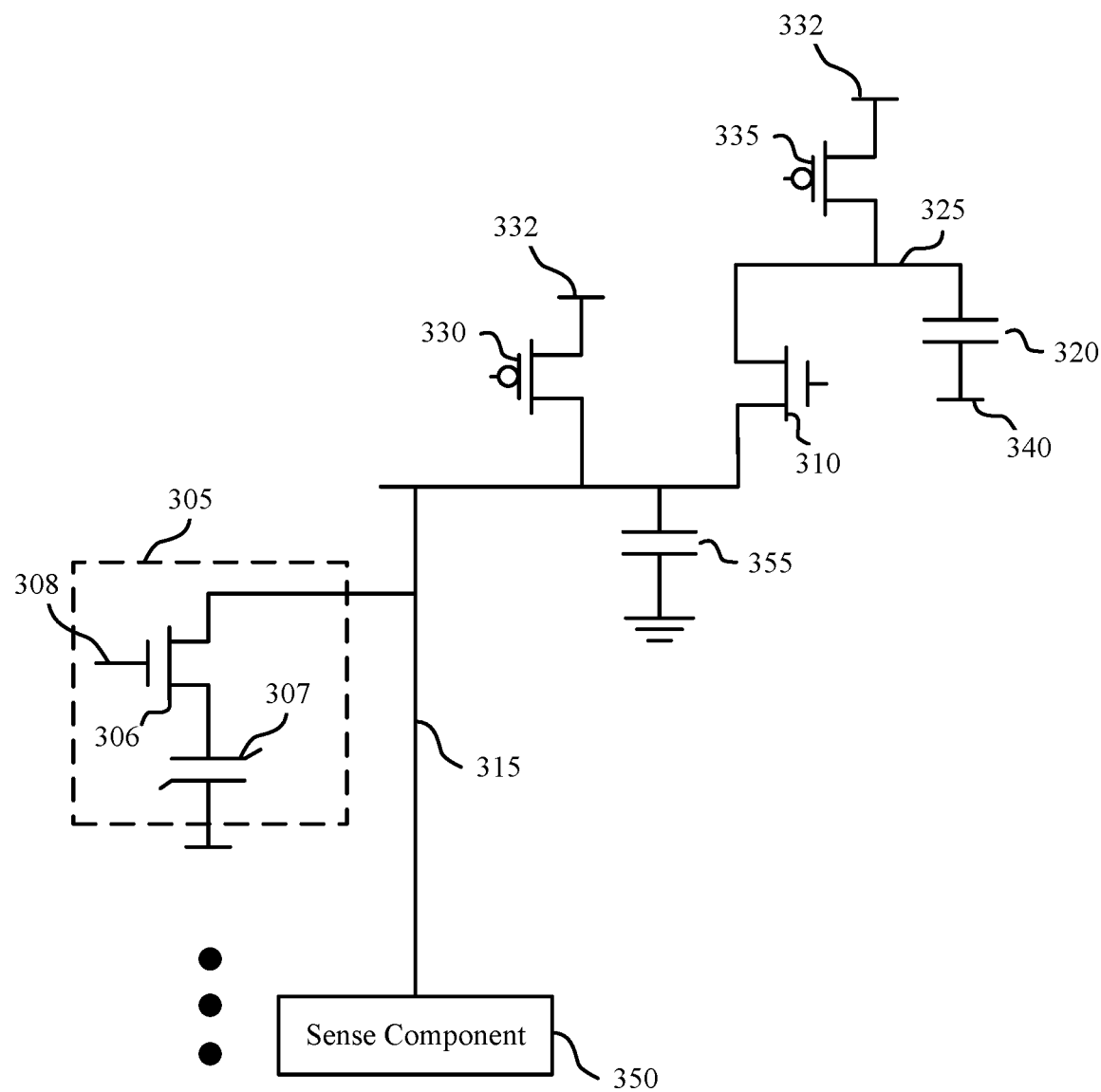
FIG. 3 illustrates an example of a circuit that supports techniques to perform a sense operation in accordance with examples as disclosed herein.

FIG. 3 illustrates an example of a circuit 300 that supports techniques to perform a sense operation in accordance with examples as disclosed herein. The circuit 300 may include a digit line 315 (e.g., a first node) coupled with a memory cell 305 and a sense component 350, which be examples of the corresponding components as described with reference to FIG. 2. For example, the memory cell may include a selector component, such as a transistor 306 having a gate coupled with a word line 308, to selectively couple a storage element of the memory cell, such as a ferroelectric capacitor 307, with the digit line 315.

In some cases, a charge stored by the ferroelectric capacitor 307 may include a polarization or dipole moment associated with the charge. For example, the ferroelectric capacitor 307 may store a first dipole moment associated with a first logic state, or a second dipole moment (e.g., opposite to the first dipole moment) associated with a second logic state. In some cases, if the memory cell stores a first state and a voltage larger than a lower operating voltage is applied to the ferroelectric capacitor, dipoles in the memory cell may switch (e.g., from a first direction to a second direction) and accordingly draw or pass a charge from the digit line 315, thus reducing a voltage of the digit line 315. Alternatively, if the memory cell stores a second state, applying a voltage larger than the lower operating voltage may not switch the dipoles (e.g., because the dipoles may already point in the second direction). Thus, the ferroelectric capacitor 307 may draw a reduced charge from the digit line 315 (e.g., relative to the charge drawn from switching the dipoles). In some cases, applying a voltage larger than an upper operating voltage of the memory cell 305 may damage or wear out the ferroelectric capacitor. Thus, during a sense operation, a voltage larger than the lower operating voltage of the memory cell 305 but lower than the upper operating voltage of the memory cell 305 may be desired.

In some cases, the circuit 300 may include a capacitor 320 to transfer charge to the digit line 315 during a sense operation, for example through a transistor 310. The transistor 310 may be, for example, an n-type metal-oxide-semiconductor field-effect transistor (MOSFET) or n-mos transistor. An n-mos transistor may include a gate, a source terminal, and a drain terminal. An n-mos transistor may couple the drain terminal to the source terminal if a voltage on the gate is higher than the source or drain terminal by a threshold voltage. An n-mos transistor may insulate the source terminal from the drain terminal if the voltage on the gate is not higher than the source or drain terminal by a threshold voltage. (e.g., may be in a cutoff or subthreshold region). As used herein, a terminal of a transistor may refer to the source terminal or drain terminal, which may be interchangeable. In some examples, a first plate of the capacitor 320 may be coupled with a terminal of the transistor 310 through a second node 325. During the sense operation, a signal or voltage pulse may be applied to a second plate 340 of the capacitor 320 to transfer a charge to the second node 325. In some examples, the circuit 300 may include a pulse generator or other circuitry to apply the voltage pulse to a terminal of the capacitor 320. The charge or a portion of the charge stored in the capacitor 320 may subsequently be transferred to the digit line 315, for example via the second node 325 and the transistor 310. In some cases, transferring a charge to the digit line 315 during the sense operation may aid in switching the dipoles of the ferroelectric capacitor, for example by maintaining the voltage of the digit line 315 above the lower operating voltage.

The circuit 300 may include a pair of switching components, such as the switching component 330 and the switching component 335. In some cases, the switching component 330 and the switching component 335 may each be an example of a transistor, such as a p-type MOSFET or p-mos transistor. A p-mos transistor may include a gate, a source terminal, and a drain terminal. A p-mos transistor may couple the drain terminal to the source terminal if a voltage on the gate is lower than the source or drain terminal by a voltage difference exceeding a threshold voltage. A p-mos transistor may insulate the source terminal from the drain terminal if the voltage on the gate is not lower than the source or drain terminal by a voltage difference exceeding the threshold voltage (e.g., may be in a cutoff or subthreshold region). Accordingly, the switching component 330 and the switching component 335 may be deactivated (e.g., become insulative) if a high voltage (e.g., higher than a voltage which is a threshold of the switching component lower than a voltage on a terminal of the switching component) is applied to a gate of the switching component 330 or the switching component 335, and may be activated (e.g., become conductive) if a low voltage is applied to a gate of the switching component 330 or the switching component 335 (e.g., the voltage on the terminals of the switching component is higher than the gate of the switching component by more than a threshold of the switching component).

In some cases, the switching components 330 and 335 may be configured to precharge the digit line 315 and the second node 325 to a first voltage (e.g., a precharge voltage). For example, the switching component 330 and the switching component 335 may couple the digit line 315 and the second node 320 with a supply node 332 at the first voltage when activated. For example, the switching components 330 and 335 may be activated (e.g., may electrically couple the digit line 315 and the second node 320 with the supply node)

during a precharge phase to bias the digit line 315 and the second node 325 with the first voltage. In some cases, after biasing the digit line 315 and the second node 325, the switching component 330 and the switching component 335 may be deactivated. Accordingly, the digit line 315 and the second node 325 may float at the first voltage. In some cases, the first voltage may be equal to or substantially equal to the upper operating voltage of the memory cell 305. Additionally or alternatively, a single switching component (e.g., the switching component 330 or the switching component 335) may be used to precharge the digit line 315 or the second node 325. In such cases, the transistor 310 may be configured to precharge the other node. That is, if the switching component 330 is used to charge the digit line 315, the second node may be precharged via the transistor 310, and if the switching component 335 is used to precharge the second node 325, the digit line may be precharged via the transistor 310.

The transistor 310 may be an example of a cascode, and thus may be configured to maintain the voltage of the digit line 315 at or below the first voltage (e.g., the upper operating voltage of the memory cell 305). In some cases, the transistor 310 may be an example of an n-type MOSFET or n-mos. That is, the transistor 310 may be activated if a high voltage is applied to the gate of the transistor 310 (e.g., a gate-to-source voltage becomes higher than a threshold of the transistor 310), and may be deactivated if a low voltage is applied to the gate of the transistor 310 (e.g., the gate-to-source voltage becomes lower than the threshold of the transistor 310). To maintain the voltage of the digit line 315, the gate of the transistor 310 may be biased to a voltage higher than the first voltage, such as a voltage approximately equal to the sum of the first voltage and the threshold voltage of the transistor 310. Accordingly, the transistor 310 may not transfer a voltage substantially higher than the first voltage to the digit line 315. In some cases, a gate bias may be applied to the transistor 310 to control the voltage transferred via the transistor 310.

Figure 4:
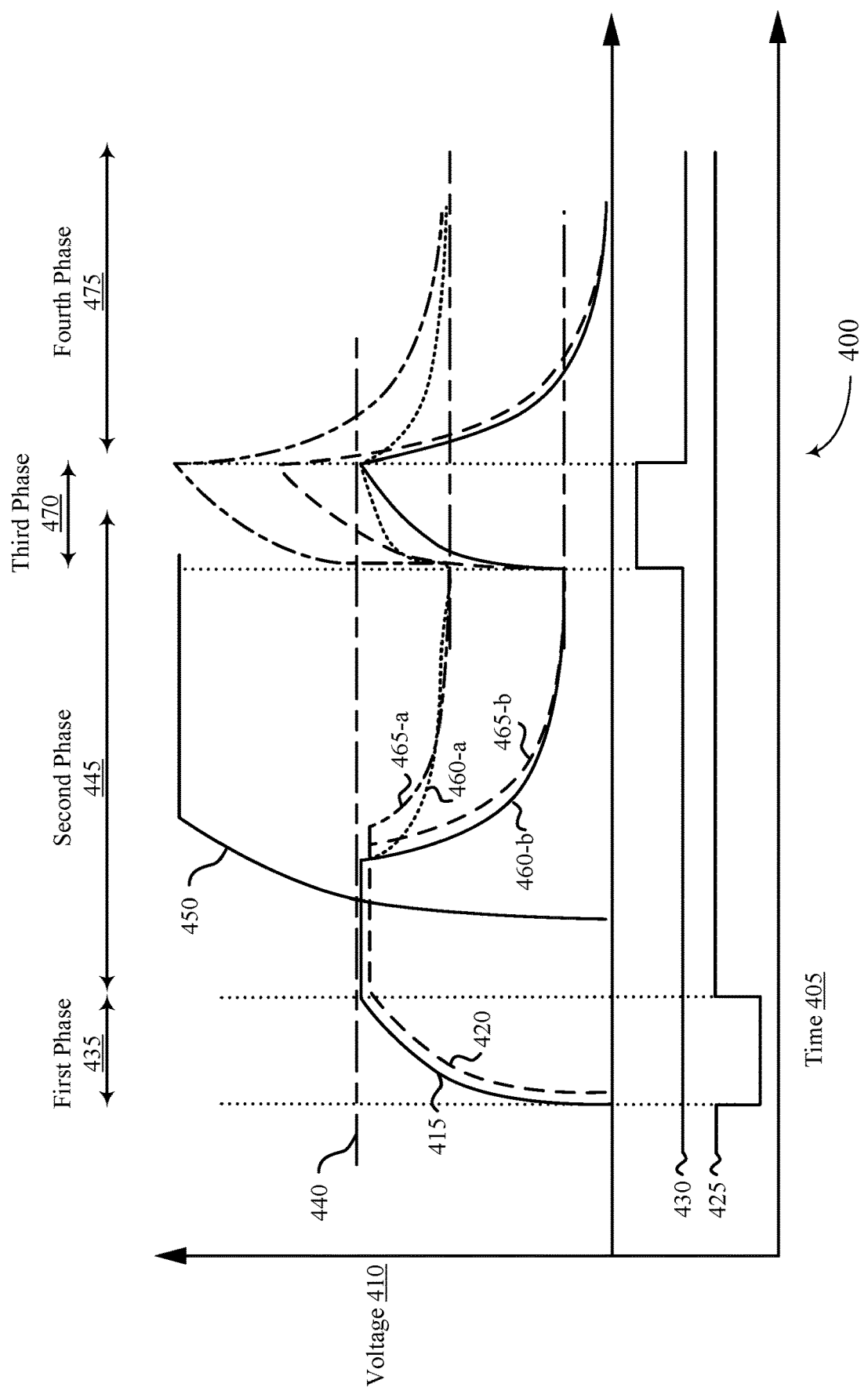
FIG. 4 illustrates an example of a timing diagram that supports techniques to perform a sense operation in accordance with examples as disclosed herein.

FIG. 4 illustrates an example of a timing diagram 400 that supports techniques to perform a sense operation in accordance with examples as disclosed herein. In some cases, the timing diagram 400 may be implemented by a circuit included in a memory device or memory system, such as the circuit 300 as described with reference to FIG. 3. The timing diagram 400 may illustrate a voltage 410 over a period of time 405 of one or more components or nodes of the circuit, such as a voltage of a first node 415 (e.g., a digit line, such as the digit line 315 as described with reference to FIG. 3) coupled with a memory cell for an access operation of the memory cell and a voltage of a second node 420 coupled with the first node, such as the second node 325 as described with reference to FIG. 3. Additionally or alternatively, the circuit may include a cascode transistor positioned between the first node and the second node, such as the transistor 310 as described with reference to FIG. 3.

In some cases, the timing diagram 400 may include a precharge signal 425. The precharge signal 425 may be applied to activate one or more switching components of the circuit, such as the switching component 330 and the switching component 335 as described with reference to FIG. 3. Additionally, the timing diagram 400 may include a boost pulse 430. The boost pulse 430 may be applied to a capacitor of the circuit, such as the capacitor 320 as described with reference to FIG. 3, and may be configured to transfer a charge to the second node (e.g., to raise or boost the voltage of the second node 420).

In some examples, the timing diagram may include a first phase 435, which may be an example of a precharge phase. During the first phase 435, the precharge signal 425 may switch states. For example, the precharge signal 425 may transition from a high voltage to a low voltage. In some cases, transitioning the precharge signal 425 to the low voltage may activate the switching components of the circuit (e.g., if the switching components are p-mos type transistors), and may electrically couple the first node, the second node, or both to first voltage 440, which may be an example of a precharge voltage. The first voltage 440 may be higher than a lower operating voltage of the memory cell (e.g., sufficiently high to switch a diploe of the memory cell), and may be lower or equal to an upper operating voltage of the memory cell.

Accordingly, the switching components may bias the first node and the second node to the first voltage 440. In some cases, the capacitor may also be biased to the first voltage 440 (e.g., because a second terminal of the capacitor may be at a ground voltage). Additionally or alternatively, during the first phase 435, a gate of the cascode transistor may be biased to a second voltage, such as a voltage equal to the sum of the first voltage 440 and a threshold voltage of the cascode transistor.

In some cases, the first phase 435 may include transitioning the precharge signal 425 from the low voltage to the high voltage to deactivate the switching components. Accordingly, the first node and the second node may isolated (e.g., electrically isolated) from the first voltage 440. Thus, the first node and the second node may be in a floating state. In some cases, the duration of the first phase 435 may be relatively fast (e.g., on the order of five nanoseconds (ns)). For example, because the circuit may include multiple switching components (e.g., two switching components), the duration of the first phase 435 may be shorter than a circuit which includes a single switching component to perform a precharge operation.

In some cases, the timing diagram 400 may include a second phase 445, which may be an example of a signal development phase. During the second phase 445, a voltage of the word line 450 may increase, which may couple the memory cell with the first node (e.g., by activating a transistor positioned between the memory cell and the first node). Accordingly, the voltage of the first node 415 may begin to decrease. In some cases, the memory cell may store a first state (e.g., a logic "1"), and may draw a first charge from the first node. Alternatively, the memory cell may store a second state (e.g., a logic "0"), and may draw a second charge greater than the first charge. For example, if the memory cell stores the second state, the voltage of the first node 415 may be sufficiently large to switch all or a portion of the dipoles of the memory cell. In some examples, the magnitude of the charge drawn from the first node may depend on the capacitance (e.g., intrinsic capacitance) of the first node, which may be determined in part by the length or size of the first node. For example, the first node may be sufficiently large to extract all the charge stored in the memory cell. Additionally or alternatively, the digit line may not be sufficiently large to extract all the charge stored in the memory cell when the digit line is precharged to a voltage not larger than the operating voltage of the memory cell, and may instead extract a portion of the charge stored in the memory cell.

Accordingly, the voltage of the first node 415 may depend on the state of the memory cell. For example, the voltage of the first node 415 may decrease to a first value 460-*a* if the memory cells stores the first state and may decrease to a second value 460-*b* if the memory cell stores the second state. In some cases, during the second phase 445, the first node may draw a charge from the second node, which may decrease the voltage of the second node 420. For example, if the memory cell stores the first state, the voltage of the second node 420 may decrease to a first value 465-*a*. Alternatively, if the memory cells stores the second state, the voltage of the second node 420 may decrease to a second value 465-*b*.

In some examples, the timing diagram 400 may include a third phase 470, which may be an example of a boost phase to provide additional charge to the memory cell. During the third phase 470, the boost pulse 430 may be applied to the capacitor to transfer a charge to the second node. For example, the boost pulse 430 may apply a voltage to a plate of the capacitor, which may subsequently transfer a charge to the second node. Accordingly, the voltage of the second node 420 may increase, for example to a voltage higher than the first voltage (e.g., higher than the precharge voltage). In some examples, the second phase 445 and the third phase 470 may at least partially overlap in time. For example, the boost pulse 430 may be applied to the capacitor while the memory cell draws a charge from the first node.

The cascode transistor may be activated during the third phase 470, during the second phase 445, or both. Accordingly, the first node may be coupled (e.g., electrically coupled) with the second node during at least a portion of the third phase 470, and a charge may be transferred from the second node to the first node. In some cases, the voltage of the second node 420 may be boosted to a voltage higher than the upper operating voltage of the memory cell. Thus, the cascode transistor may be configured to maintain or control the voltage of the first node 415 at or below the upper operating voltage of the memory cell. For example, the gate of the cascode transistor may be biased to a voltage approximately equal to the sum of the first voltage 440 and the threshold voltage of the cascode transistor. In some cases, a second front or second pulse may be applied to the capacitor. For example, a the boost pulse 430 may include an additional pulse, which may transfer additional charge to the second node.

In some cases, the timing diagram 400 may include a fourth phase 475. During the fourth phase 475, the boost pulse 430 may end (e.g., the voltage applied to the capacitor may transition from a high voltage to a low voltage). In some cases, the memory cell may continue to draw charge from the first node. Accordingly, the voltage of the first node 415 and the voltage of the second node 420 may decrease.

In some cases, during the third phase 470 and if the memory cell stores the second state, the boost pulse 430 may cause one or more dipoles of the memory cell to switch, for example if not all of the dipoles of the memory switched during the second phase 445. Thus, the memory cell may draw an additional charge from the first node during the fourth phase 475. Accordingly, the voltage of the first node 415 and the voltage of the second node 420 may decrease, for example to a voltage lower than the voltage reached during the second phase 445. Additionally or alternatively (e.g., if the memory cell stores the first value), no dipoles may be switched during the boost pulse 430. Accordingly, after the third phase 470, the voltage of the first node 415 may return to the same or substantially same voltage as the voltage reached during the second phase 445.

The final voltage on the first node 415 (e.g., the voltage after the fourth phase 475) may therefore depend on the state stored in the memory cell. Accordingly, in some cases, a sense component, such as the sense component 350 as described with reference to FIG. 3, may be used to determine the state of the memory cell. For example, the sense component may include a sense amplifier to compare the voltage of the first node 415 to a reference voltage to determine whether the memory cell stored the first state or the second state. For example, reference voltage may be in between voltage levels for the first node 415 for the first state and the second state after the fourth phase 475. In some examples, after the sense component has determined the state of the memory cell, the circuit may perform an operation to restore or write back the sensed state to the memory cell, such as a refresh operation.

Figure 5:
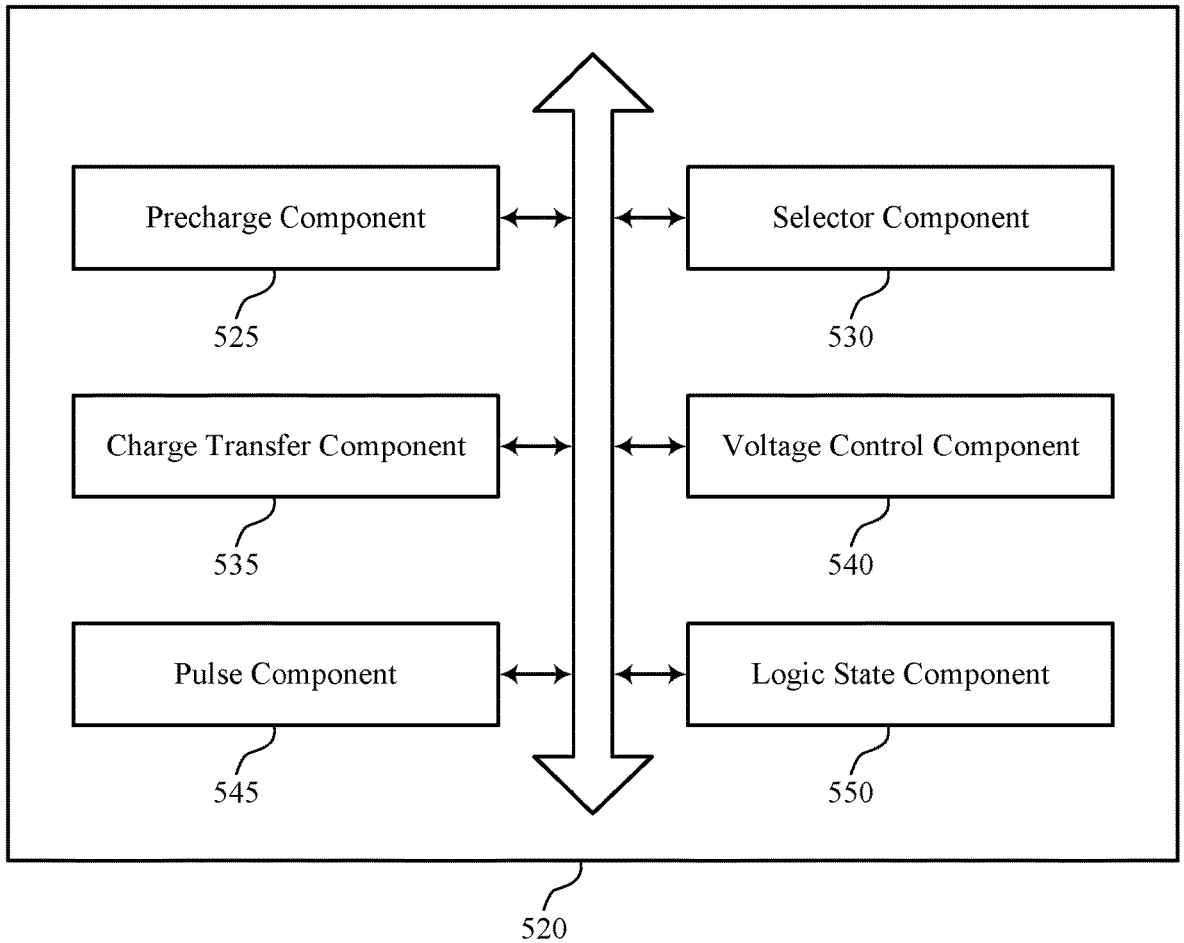
FIG. 5 shows a block diagram of a memory device that supports techniques to perform a sense operation in accordance with examples as disclosed herein.

FIG. 5 shows a block diagram 500 of a memory device 520 that supports techniques to perform a sense operation in accordance with examples as disclosed herein. The memory device 520 may be an example of aspects of a memory device as described with reference to FIGS. 1 through 4. The memory device 520, or various components thereof, may be an example of means for performing various aspects of techniques to perform a sense operation as described herein. For example, the memory device 520 may include a precharge component 525, a selector component 530, a charge transfer component 535, a voltage control component 540, a pulse component 545, a logic state component 550, or any combination thereof. Each of these components may communicate, directly or indirectly, with one another (e.g., via one or more buses).

The precharge component 525 may be configured as or otherwise support a means for precharging, during a first phase of an access operation for a memory cell, a first node and a second node to a first voltage, the first node coupled with the second node via a transistor. The selector component 530 may be configured as or otherwise support a means for coupling, during a second phase of the access operation, a storage element of the memory cell with the first node, where the storage element is configured to transfer a first charge from the first node based at least in part on coupling the storage element with the first node during the second phase of the access operation. The charge transfer component 535 may be configured as or otherwise support a means for transferring, during a third phase of the access operation, a second charge to the second node, where the transistor transfers a third charge to the first node based at least in part on transferring the second charge to the second node. In some examples, the charge transfer component 535 may be configured as or otherwise support a means for transferring, during a fourth phase of the access operation, a fourth charge from the second node, where a second voltage of the first node is based at least in part on a fifth charge transferred from the first node during at least one of the third phase or the fourth phase based at least in part on the storage element being coupled with the first node.

In some examples, the voltage control component 540 may be configured as or otherwise support a means for applying a third voltage to a gate of the transistor such that the transistor passes a fourth voltage from the second node to the first node during the third phase that is not higher than the first voltage.

In some examples, a magnitude of the third voltage is greater than a magnitude of the first voltage.

In some examples, the transistor passes at least a portion of the fourth charge from the first node to the second node during the fourth phase based at least in part on applying the third voltage to the gate of the transistor.

In some examples, the pulse component 545 may be configured as or otherwise support a means for applying, during the third phase of the access operation, a pulse to a third node coupled with the second node via a capacitor, where transferring the second charge to the second node is based at least in part on applying the pulse.

In some examples, a first terminal of the transistor is coupled with the second node and a second terminal of the transistor is coupled with the first node.

In some examples, the precharge component 525 may be configured as or otherwise support a means for activating a first switching component coupled with the first node, where precharging the first node to the first voltage is based at least in part on activating the first switching component. In some examples, the precharge component 525 may be configured as or otherwise support a means for activating a second switching component coupled with the second node, where precharging the second node to the first voltage is based at least in part on activating the second switching component.

In some examples, the precharge component 525 may be configured as or otherwise support a means for deactivating the first switching component. In some examples, the precharge component 525 may be configured as or otherwise support a means for deactivating the second switching component, where coupling the storage element with the first node is based at least in part on deactivating the first switching component and deactivating the second switching component.

In some examples, the first switching component, the second switching component, or both include a p-mos transistor.

In some examples, the logic state component 550 may be configured as or otherwise support a means for determining, based at least in part on transferring the fourth charge, a logical state of the memory cell, where the logical state of the memory cell is based at least in part on the second voltage of the first node.

In some examples, the second phase and the third phase at least partially overlap in time.

In some examples, a magnitude of the first charge is based at least in part on a logical state of the memory cell.

In some examples, the memory cell includes a ferroelectric capacitor.

Figure 6:
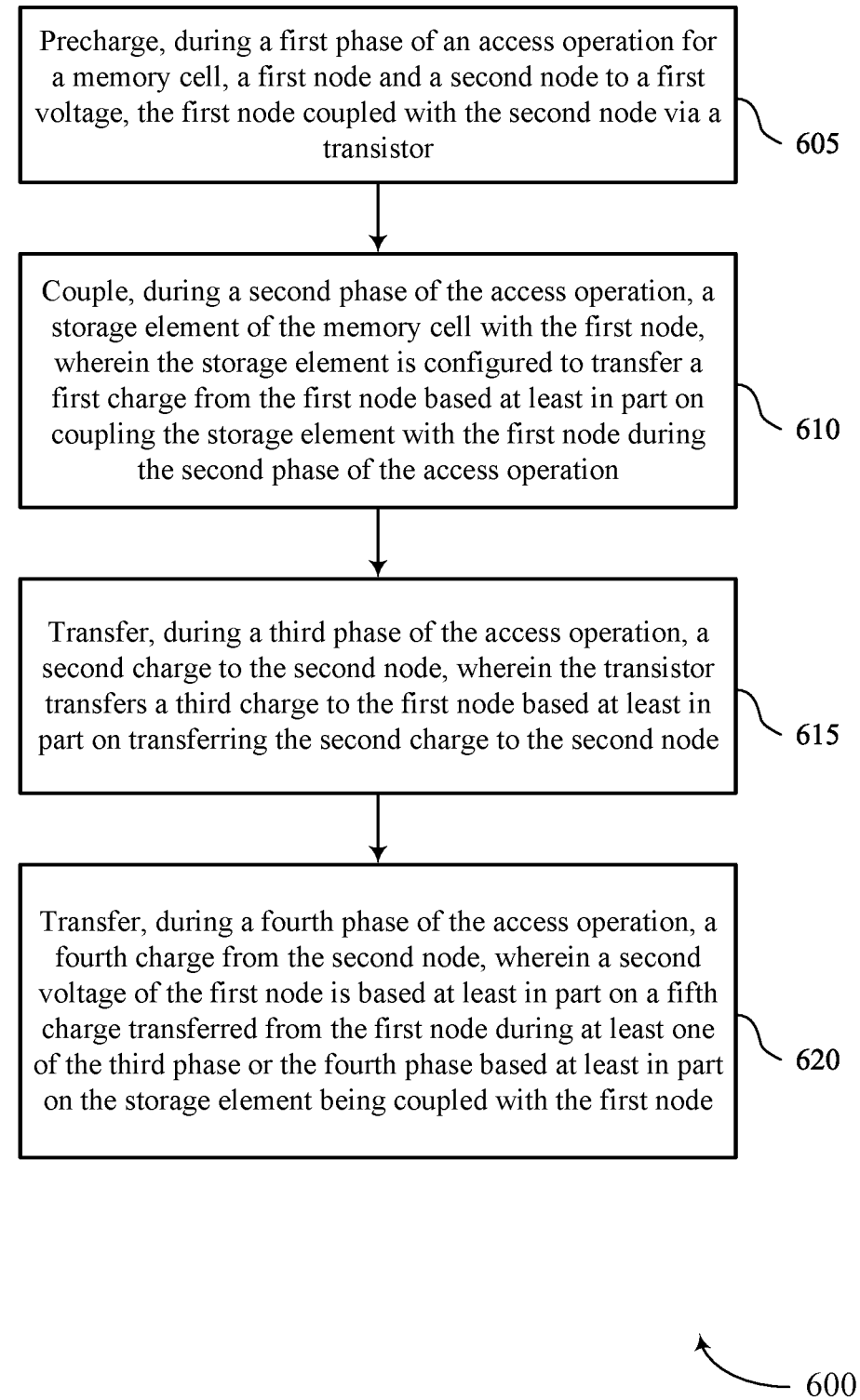
FIG. 6 shows a flowchart illustrating a method or methods that support techniques to perform a sense operation in accordance with examples as disclosed herein.

FIG. 6 shows a flowchart illustrating a method 600 that supports techniques to perform a sense operation in accordance with examples as disclosed herein. The operations of method 600 may be implemented by a memory device or its components as described herein. For example, the operations of method 600 may be performed by a memory device as described with reference to FIGS. 1 through 5. In some examples, a memory device may execute a set of instructions to control the functional elements of the device to perform the described functions. Additionally or alternatively, the memory device may perform aspects of the described functions using special-purpose hardware.

At 605, the method may include precharging, during a first phase of an access operation for a memory cell, a first node and a second node to a first voltage, the first node coupled with the second node via a transistor. The operations of 605 may be performed in accordance with examples as disclosed herein. In some examples, aspects of the operations of 605 may be performed by a precharge component 525 as described with reference to FIG. 5.

At 610, the method may include coupling, during a second phase of the access operation, a storage element of the memory cell with the first node, where the storage element is configured to transfer a first charge from the first node based at least in part on coupling the storage element with the first node during the second phase of the access operation. The operations of 610 may be performed in accordance with examples as disclosed herein. In some examples, aspects of the operations of 610 may be performed by a selector component 530 as described with reference to FIG. 5.

At 615, the method may include transferring, during a third phase of the access operation, a second charge to the second node, where the transistor transfers a third charge to the first node based at least in part on transferring the second charge to the second node. The operations of 615 may be performed in accordance with examples as disclosed herein. In some examples, aspects of the operations of 615 may be performed by a charge transfer component 535 as described with reference to FIG. 5.

At 620, the method may include transferring, during a fourth phase of the access operation, a fourth charge from the second node, where a second voltage of the first node is based at least in part on a fifth charge transferred from the first node during at least one of the third phase or the fourth phase based at least in part on the storage element being coupled with the first node. The operations of 620 may be performed in accordance with examples as disclosed herein. In some examples, aspects of the operations of 620 may be performed by a charge transfer component 535 as described with reference to FIG. 5.

In some examples, an apparatus as described herein may perform a method or methods, such as the method 600. The apparatus may include, features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for precharging, during a first phase of an access operation for a memory cell, a first node and a second node to a first voltage, the first node coupled with the second node via a transistor; coupling, during a second phase of the access operation, a storage element of the memory cell with the first node, where the storage element is configured to transfer a first charge from the first node based at least in part on coupling the storage element with the first node during the second phase of the access operation; transferring, during a third phase of the access operation, a second charge to the second node, where the transistor transfers a third charge to the first node based at least in part on transferring the second charge to the second node; and transferring, during a fourth phase of the access operation, a fourth charge from the second node, where a second voltage of the first node is based at least in part on a fifth charge transferred from the first node during at least one of the third phase or the fourth phase based at least in part on the storage element being coupled with the first node.

Aspect 2: The method, apparatus, or non-transitory computer-readable medium of aspect 1, further including operations, features, circuitry, logic, means, or instructions, or any combination thereof for applying a third voltage to a gate of the transistor such that the transistor passes a fourth voltage from the second node to the first node during the third phase that is not higher than the first voltage.

Aspect 3: The method, apparatus, or non-transitory computer-readable medium of aspect 2, further including operations, features, circuitry, logic, means, or instructions, or any combination thereof for a magnitude of the third voltage is greater than a magnitude of the first voltage.

Aspect 4: The method, apparatus, or non-transitory computer-readable medium of any of aspects 2 through 3, further including operations, features, circuitry, logic, means, or instructions, or any combination thereof for the transistor passes at least a portion of the fourth charge from the first node to the second node during the fourth phase based at least in part on applying the third voltage to the gate of the transistor.

Aspect 5: The method, apparatus, or non-transitory computer-readable medium of any of aspects 1 through 4, further including operations, features, circuitry, logic, means, or instructions, or any combination thereof for applying, during the third phase of the access operation, a pulse to a third node coupled with the second node via a capacitor, where transferring the second charge to the second node is based at least in part on applying the pulse.

Aspect 6: The method, apparatus, or non-transitory computer-readable medium of any of aspects 1 through 5, further including operations, features, circuitry, logic, means, or instructions, or any combination thereof for a first terminal of the transistor is coupled with the second node and a second terminal of the transistor is coupled with the first node.

Aspect 7: The method, apparatus, or non-transitory computer-readable medium of any of aspects 1 through 6, further including operations, features, circuitry, logic, means, or instructions, or any combination thereof for activating a first switching component coupled with the first node, where precharging the first node to the first voltage is based at least in part on activating the first switching component and activating a second switching component coupled with the second node, where precharging the second node to the first voltage is based at least in part on activating the second switching component.

Aspect 8: The method, apparatus, or non-transitory computer-readable medium of aspect 7, further including operations, features, circuitry, logic, means, or instructions, or any combination thereof for deactivating the first switching component and deactivating the second switching component, where coupling the storage element with the first node is based at least in part on deactivating the first switching component and deactivating the second switching component.

Aspect 9: The method, apparatus, or non-transitory computer-readable medium of any of aspects 7 through 8, further including operations, features, circuitry, logic, means, or instructions, or any combination thereof for the first switching component, the second switching component, or both include a p-mos transistor.

Aspect 10: The method, apparatus, or non-transitory computer-readable medium of any of aspects 1 through 9, further including operations, features, circuitry, logic, means, or instructions, or any combination thereof for determining, based at least in part on transferring the fourth charge, a logical state of the memory cell, where the logical state of the memory cell is based at least in part on the second voltage of the first node.

Aspect 11: The method, apparatus, or non-transitory computer-readable medium of any of aspects 1 through 10, further including operations, features, circuitry, logic, means, or instructions, or any combination thereof for the second phase and the third phase at least partially overlap in time.

Aspect 12: The method, apparatus, or non-transitory computer-readable medium of any of aspects 1 through 11, further including operations, features, circuitry, logic, means, or instructions, or any combination thereof for a magnitude of the first charge is based at least in part on a logical state of the memory cell.

Aspect 13: The method, apparatus, or non-transitory computer-readable medium of any of aspects 1 through 12, further including operations, features, circuitry, logic, means, or instructions, or any combination thereof for the memory cell includes a ferroelectric capacitor.

It should be noted that the methods described herein are possible implementations, and that the operations and the steps may be rearranged or otherwise modified and that other implementations are possible. Furthermore, portions from two or more of the methods may be combined.

An apparatus is described. The following provides an overview of aspects of the apparatus as described herein:

Aspect 14: An apparatus, including: a first switching component coupled with a first node and configured to precharge the first node to a first voltage during a first phase of an access operation; a transistor having a first terminal coupled with the first node and a second terminal coupled with a second node; a second switching component coupled with the second node and configured to precharge the second node to the first voltage during the first phase of the access operation; a memory cell including a storage element and a selection component configured to couple the first node with the storage element during a second phase of the access operation, where the storage element is configured to transfer a first charge from the first node based at least in part on coupling the storage element with the first node during the second phase of the access operation; a capacitor coupled between the second node and a third node; and a pulse generator coupled with the third node and configured to apply a pulse to the third node during a third phase of the access operation, where the capacitor is configured to transfer a second charge to the second node at a first transition of the pulse of the third node and to transfer a third charge from the second node at a second transition of the pulse of the third node, and where a second voltage of the first node is based at least in part on a fourth charge transferred from the first node based at least in part on the storage element during the third phase.

Aspect 15: The apparatus of aspect 14, where a gate voltage of the transistor is biased to a third voltage that is greater than the first voltage during the third phase of the access operation.

Aspect 16: The apparatus of any of aspects 14 through 15, where the first switching component and the second switching component are activated during the first phase based at least in part on an activation signal, coupling the first node with the storage element is based at least in part on deactivating the first switching component and deactivating the second switching component.

Aspect 17: The apparatus of any of aspects 14 through 16, further including: a sense circuit configured to determine a logical state of the memory cell, based at least in part on the second voltage of the first node.

An apparatus is described. The following provides an overview of aspects of the apparatus as described herein:

Aspect 18: An apparatus, including: a memory cell including a storage element; and a controller coupled with the memory cell and configured to cause the apparatus to: precharge, during a first phase of an access operation for the memory cell, a first node and a second node to a first voltage, the first node coupled with the second node via a transistor; couple, during a second phase of the access operation, the storage element of the memory cell with the first node, where the storage element is configured to transfer a first charge from the first node based at least in part on coupling the storage element with the first node during the second phase of the access operation; transfer, during a third phase of the access operation, a second charge to the second node, where the transistor is configured to transfer a third charge to the first node based at least in part on transferring the second charge to the second node; and transfer, during a fourth phase of the access operation, a fourth charge from the second node, where a second voltage of the first node is based at least in part on a fifth charge transferred from the first node during at least one of the third phase or the fourth phase based at least in part on the storage element being coupled with the first node.

Aspect 19: The apparatus of aspect 18, where the controller is further configured to cause the apparatus to apply a third voltage to a gate of the transistor such that the transistor passes a fourth voltage from the second node to the first node during the third phase that is not higher than the first voltage.

Aspect 20: The apparatus of aspect 19, where a magnitude of the third voltage is greater than a magnitude of the first voltage.

Aspect 21: The apparatus of any of aspects 18 through 20, where a first terminal of the transistor is coupled with the second node and a second terminal of the transistor is coupled with the first node.

Aspect 22: The apparatus of any of aspects 18 through 21, where the controller is further configured to cause the apparatus to: activate a first switching component coupled with the first node, where precharging the first node to the first voltage is based at least in part on activating the first switching component; and activate a second switching component coupled with the second node, where precharging the second node to the first voltage is based at least in part on activating the second switching component.

Aspect 23: The apparatus of aspect 22, where the controller is further configured to cause the apparatus to deactivate the first switching component; and deactivate the second switching component, where coupling the storage element with the first node is based at least in part on deactivating the first switching component and deactivating the second switching component.

Aspect 24: The apparatus of any of aspects 22 through 23, where the first switching component, the second switching component, or both include a p-mos transistor.

Aspect 25: The apparatus of any of aspects 18 through 24, where the controller is further configured to cause the apparatus to: determine, based at least in part on transferring the fourth charge, a logical state of the memory cell, where the logical state of the memory cell based at least in part on the second voltage of the first node.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   precharging, during a first phase of an access operation for a memory cell, a first node and a second node to a first voltage, the first node coupled with the second node via a transistor;
   coupling, during a second phase of the access operation, a storage element of the memory cell with the first node, wherein the storage element is configured to transfer a first charge from the first node based at least in part on coupling the storage element with the first node during the second phase of the access operation;
   transferring, during a third phase of the access operation, a second charge to the second node, wherein the transistor transfers a third charge to the first node based at least in part on transferring the second charge to the second node; and
   transferring, during a fourth phase of the access operation, a fourth charge from the second node, wherein a second voltage of the first node is based at least in part on a fifth charge transferred from the first node during at least one of the third phase or the fourth phase based at least in part on the storage element being coupled with the first node.

2. The method of claim 1, further comprising:
applying a third voltage to a gate of the transistor such that the transistor passes a fourth voltage from the second node to the first node during the third phase that is not higher than the first voltage.

3. The method of claim 2, wherein a magnitude of the third voltage is greater than a magnitude of the first voltage.

4. The method of claim 2, wherein the transistor passes at least a portion of the fourth charge from the first node to the second node during the fourth phase based at least in part on applying the third voltage to the gate of the transistor.

5. The method of claim 1, further comprising:
applying, during the third phase of the access operation, a pulse to a third node coupled with the second node via a capacitor, wherein transferring the second charge to the second node is based at least in part on applying the pulse.

6. The method of claim 1, wherein a first terminal of the transistor is coupled with the second node and a second terminal of the transistor is coupled with the first node.

7. The method of claim 1, further comprising:
activating a first switching component coupled with the first node, wherein precharging the first node to the first voltage is based at least in part on activating the first switching component; and
activating a second switching component coupled with the second node, wherein precharging the second node to the first voltage is based at least in part on activating the second switching component.

8. The method of claim 7, further comprising:
deactivating the first switching component; and
deactivating the second switching component, wherein coupling the storage element with the first node is based at least in part on deactivating the first switching component and deactivating the second switching component.

9. The method of claim 7, wherein the first switching component, the second switching component, or both comprise a p-mos transistor.

10. The method of claim 1, further comprising:
determining, based at least in part on transferring the fourth charge, a logical state of the memory cell, wherein the logical state of the memory cell is based at least in part on the second voltage of the first node.

11. The method of claim 1, wherein the second phase and the third phase at least partially overlap in time.

12. The method of claim 1, wherein a magnitude of the first charge is based at least in part on a logical state of the memory cell.

13. The method of claim 1, wherein the memory cell comprises a ferroelectric capacitor.

14. An apparatus, comprising:
a first switching component coupled with a first node and configured to precharge the first node to a first voltage during a first phase of an access operation;
a transistor having a first terminal coupled with the first node and a second terminal coupled with a second node;
a second switching component coupled with the second node and configured to precharge the second node to the first voltage during the first phase of the access operation;
a memory cell comprising a storage element and a selection component configured to couple the first node with the storage element during a second phase of the access operation, wherein the storage element is configured to transfer a first charge from the first node based at least in part on coupling the storage element with the first node during the second phase of the access operation;
a capacitor coupled between the second node and a third node; and
a pulse generator coupled with the third node and configured to apply a pulse to the third node during a third phase of the access operation, wherein the capacitor is configured to transfer a second charge to the second node at a first transition of the pulse of the third node and to transfer a third charge from the second node at a second transition of the pulse of the third node, and wherein a second voltage of the first node is based at least in part on a fourth charge transferred from the first node based at least in part on the storage element during the third phase.

15. The apparatus of claim 14, wherein a gate voltage of the transistor is biased to a third voltage that is greater than the first voltage during the third phase of the access operation.

16. The apparatus of claim 14, wherein the first switching component and the second switching component are activated during the first phase based at least in part on an activation signal, and coupling the first node with the storage element is based at least in part on deactivating the first switching component and deactivating the second switching component.

17. The apparatus of claim 14, further comprising:
a sense circuit configured to determine a logical state of the memory cell, based at least in part on the second voltage of the first node.

18. An apparatus, comprising:
a memory cell comprising a storage element; and
a controller coupled with the memory cell and configured to cause the apparatus to:
precharge, during a first phase of an access operation for the memory cell, a first node and a second node to a first voltage, the first node coupled with the second node via a transistor;
couple, during a second phase of the access operation, the storage element of the memory cell with the first node, wherein the storage element is configured to transfer a first charge from the first node based at least in part on coupling the storage element with the first node during the second phase of the access operation;
transfer, during a third phase of the access operation, a second charge to the second node, wherein the transistor is configured to transfer a third charge to the first node based at least in part on transferring the second charge to the second node; and
transfer, during a fourth phase of the access operation, a fourth charge from the second node, wherein a second voltage of the first node is based at least in part on a fifth charge transferred from the first node during at least one of the third phase or the fourth phase based at least in part on the storage element being coupled with the first node.

19. The apparatus of claim 18, wherein the controller is further configured to cause the apparatus to:
apply a third voltage to a gate of the transistor such that the transistor passes a fourth voltage from the second node to the first node during the third phase that is not higher than the first voltage.

20. The apparatus of claim 19, wherein a magnitude of the third voltage is greater than a magnitude of the first voltage.

21. The apparatus of claim 18, wherein a first terminal of the transistor is coupled with the second node and a second terminal of the transistor is coupled with the first node.

22. The apparatus of claim 18, wherein the controller is further configured to cause the apparatus to:
- activate a first switching component coupled with the first node, wherein precharging the first node to the first voltage is based at least in part on activating the first switching component; and
- activate a second switching component coupled with the second node, wherein precharging the second node to the first voltage is based at least in part on activating the second switching component.

23. The apparatus of claim 22, wherein the controller is further configured to cause the apparatus to:
- deactivate the first switching component; and
- deactivate the second switching component, wherein coupling the storage element with the first node is based at least in part on deactivating the first switching component and deactivating the second switching component.

24. The apparatus of claim 22, wherein the first switching component, the second switching component, or both comprise a p-mos transistor.

25. The apparatus of claim 18, wherein the controller is further configured to cause the apparatus to:
- determine, based at least in part on transferring the fourth charge, a logical state of the memory cell, wherein the logical state of the memory cell based at least in part on the second voltage of the first node.

* * * * *